US007405978B2

(12) United States Patent
Hahn et al.

(10) Patent No.: US 7,405,978 B2
(45) Date of Patent: Jul. 29, 2008

(54) NONVOLATILE SEMICONDUCTOR MEMORY DEVICE HAVING BITLINES EXTENDING FROM CELL ARRAY IN SINGLE DIRECTION

(75) Inventors: Wook-Ghee Hahn, Hwaseong-si (KR); Dae Seok Byeon, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 94 days.

(21) Appl. No.: 11/513,157

(22) Filed: Aug. 31, 2006

(65) Prior Publication Data

US 2007/0053218 A1    Mar. 8, 2007

(30) Foreign Application Priority Data

Sep. 2, 2005    (KR) .................... 10-2005-0081553

(51) Int. Cl.
 *G11C 16/24* (2006.01)
(52) U.S. Cl. ........................... 365/185.25; 365/185.02; 365/185.17
(58) Field of Classification Search ............ 365/185.17, 365/185.02, 185.25
 See application file for complete search history.

(56) References Cited

U.S. PATENT DOCUMENTS

| 6,927,990 B2 * | 8/2005 | Mukai ...................... 365/63 |
| 7,110,292 B2 * | 9/2006 | Hahn et al. ............ 365/185.03 |
| 2004/0057266 A1 | 3/2004 | Mukai |
| 2007/0053218 A1 * | 3/2007 | Hahn et al. .................. 365/63 |

FOREIGN PATENT DOCUMENTS

| JP | 2004055617 | 2/2004 |
| JP | 2007-73962 | * 3/2007 |
| KR | 100172443 | 10/1998 |
| KR | 100221024 | 6/1999 |

* cited by examiner

*Primary Examiner*—Andrew Q Tran
(74) *Attorney, Agent, or Firm*—Volentine & Whitt, PLLC

(57) ABSTRACT

A semiconductor memory device comprises a cell array including a plurality of memory cells. The semiconductor memory device further comprises a plurality of bitlines formed in a bit layer and connected to the plurality of memory cells, wherein the bitlines extend from the cell array along a single direction. A common source line is formed in a common source layer and adapted to provide a predetermined source voltage to the plurality of memory cells. A voltage control block comprising a plurality of voltage control circuits adapted to control the voltage levels of the plurality of bitlines through voltage supply lines formed in a voltage-line metal layer is formed on one side of the cell array.

19 Claims, 13 Drawing Sheets

NONVOLATILE SEMICONDUCTOR MEMORY DEVICE HAVING BITLINES EXTENDING FROM CELL ARRAY IN SINGLE DIRECTION

BACKGROUND OF THE INVENTION

1. Field of the Invention

The invention relates generally to a nonvolatile semiconductor memory device. More particularly, the invention relates to a nonvolatile semiconductor memory device constructed with bitlines extending from a cell array in a single direction.

A claim of priority is made to Korean Patent Application No. 2005-81553, filed on Sep. 2, 2005, the disclosure of which is hereby incorporated by reference in its entirety.

2. Description of Related Art

A conventional nonvolatile semiconductor memory device comprises a plurality of memory cells arranged in a cell array, and various peripheral circuits adapted to control the transfer of data to and from the cell array. The memory cells in the cell array are connected to a plurality of corresponding bitlines used to transfer data to and from the memory cells. Each of the bitlines can be individually controlled by either charging it to a power source voltage or discharging it to ground using a voltage control block.

FIGS. 1 and 2 are circuit and layout diagrams showing interconnections between bitlines and voltage control blocks in a conventional nonvolatile semiconductor memory device.

Referring to FIGS. 1 and 2, the conventional nonvolatile semiconductor memory device comprises a cell array 10, a lower voltage control block 20, and an upper voltage control block 30.

Cell array 10 contains a plurality of bitlines extending up and down. In particular, cell array 10 comprises four bitlines BL1, BL2, BL5, and BL6 extending down into lower voltage control block 20, and four bitlines BL3, BL4, BL7, and BL8 extending up into upper voltage control block 30. Bitlines BL1 through BL8 are formed in respective bit layers BMT connected to voltage control blocks 20 and 30. In the conventional nonvolatile semiconductor memory device shown in FIGS. 1 and 2, pairs of adjacent bitlines extending in the same direction are coupled to respective latch blocks 41, 42, 43, or 44.

FIGS. 3 and 4 show respective layout patterns for voltage control blocks 20 and 30. In FIGS. 3 and 4, power source voltage lines 21, 25, 31, and 35 are connected to a power source supplying a power source voltage VDD, and ground voltage lines 23, 27, 33, and 37 are connected to ground. Power source voltage lines 21, 25, 31, and 35, and ground voltage lines 23, 27, 33, and 37 are formed in a metal layer MET, which is formed after bit layers BMT.

Power source voltage lines, 21, 25, 31, and 35, and ground voltage lines, 23, 27, 33, and 37, are connected to source/drain junctions of respective pre-charging and discharging transistors TD and TS through respective bit layers (BMT) 26 and 28 (See, FIGS. 1 and 5). Thus, when bitlines BL1 through BL8 extend toward a single side of cell array 10, half of bitlines BL1 through BL8 intersect bit layers, 26 and 28, which are respectively connected to power source voltage VDD and ground VSS. Accordingly, bitlines BL1 through BL8 are generally divided in half between lower and upper voltage control blocks 20 and 30.

In the conventional nonvolatile semiconductor memory device employing lower and upper control blocks 20 and 30, the timing of data passing through lower and upper control blocks 20 and 30 can be skewed due to slight differences in the lengths of data buses carrying the data. The data skew tends to complicate the design of control circuits used to operate the semiconductor memory device.

Furthermore, by having bitlines extending in more than one direction away from the cell array, the size of the memory device is significantly increased.

SUMMARY OF THE INVENTION

According to one embodiment of the present invention, a nonvolatile semiconductor memory device comprises a cell array comprising a plurality of memory cells, and a plurality of bitlines formed in a bit layer and connected to the plurality of memory cells, wherein the bitlines extend from the cell array along a first direction. The device further comprises a common source line formed in a common source layer and adapted to provide a predetermined source voltage to the plurality of memory cells, and a voltage control block comprising a plurality of voltage control circuits adapted to control the voltage levels of the plurality of bitlines through voltage supply lines formed in a voltage-line metal layer. The voltage control circuits are formed on only one side of the cell array.

According to another embodiment of the present invention, a nonvolatile semiconductor memory device comprises a cell array comprising a plurality of memory cells, and a plurality of bitlines formed in a bit layer and connected to the plurality of memory cells, wherein the bitlines extend from the cell array along a first direction. The device further comprises a common source line formed in a common source layer and adapted to provide a predetermined source voltage to the plurality of memory cells, and a voltage control block comprising a plurality of voltage control circuits adapted to control the voltage levels of the plurality of bitlines through voltage supply lines formed in a voltage-line metal layer below the bit layer.

BRIEF DESCRIPTION OF THE DRAWINGS

The invention is described below in relation to several embodiments illustrated in the accompanying drawings. Throughout the drawings like reference numbers indicate like exemplary elements, components, or steps. In the drawings.

DESCRIPTION OF EXEMPLARY EMBODIMENTS

Exemplary embodiments of the invention are described below with reference to the corresponding drawings. These embodiments are presented as teaching examples. The actual scope of the invention is defined by the claims that follow.

Figure 1:
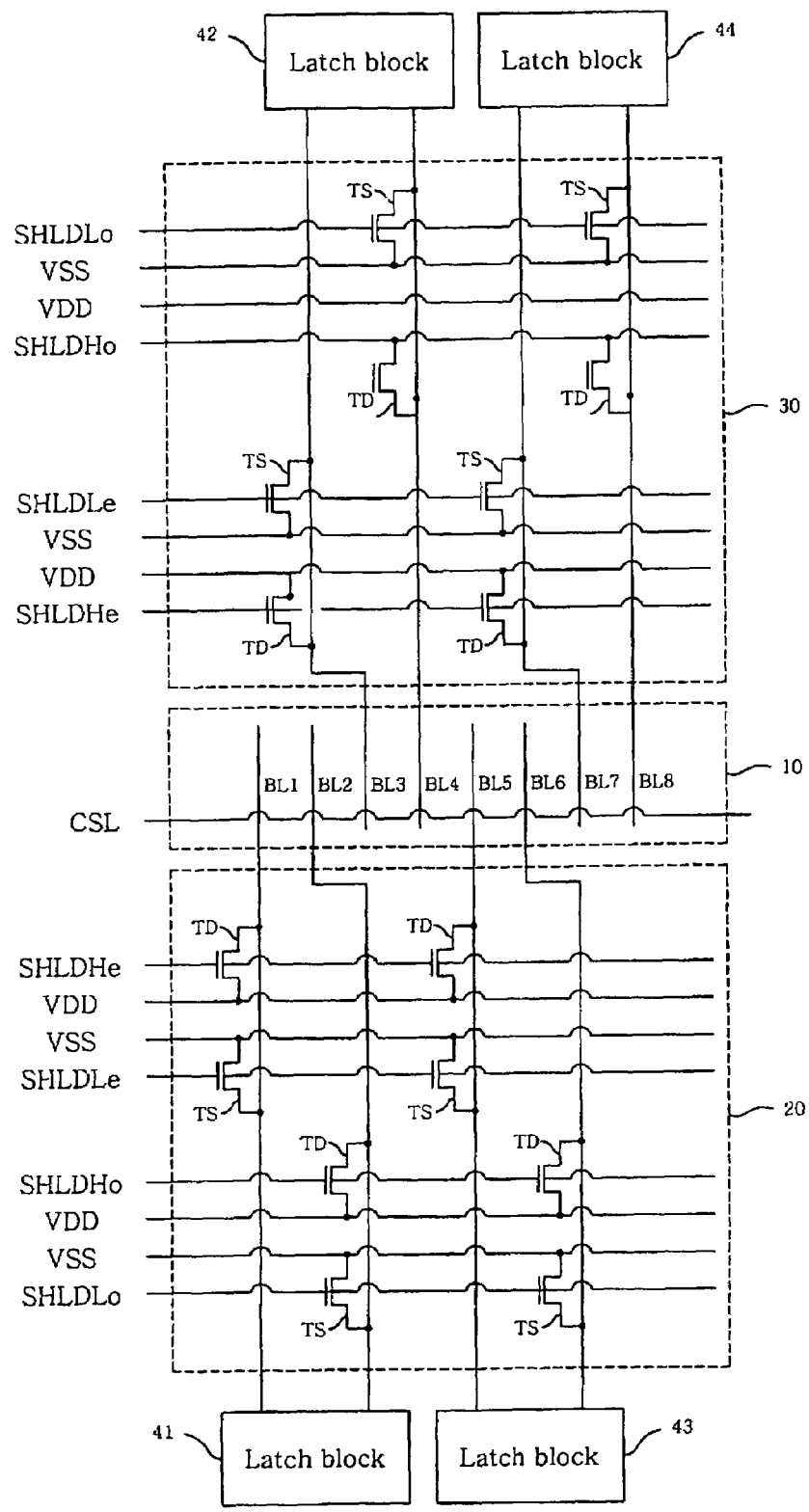
FIGS. 1 and 2 are circuit and layout diagrams showing interconnections between bitlines and voltage control blocks in a conventional nonvolatile semiconductor memory device.
Figure 2:
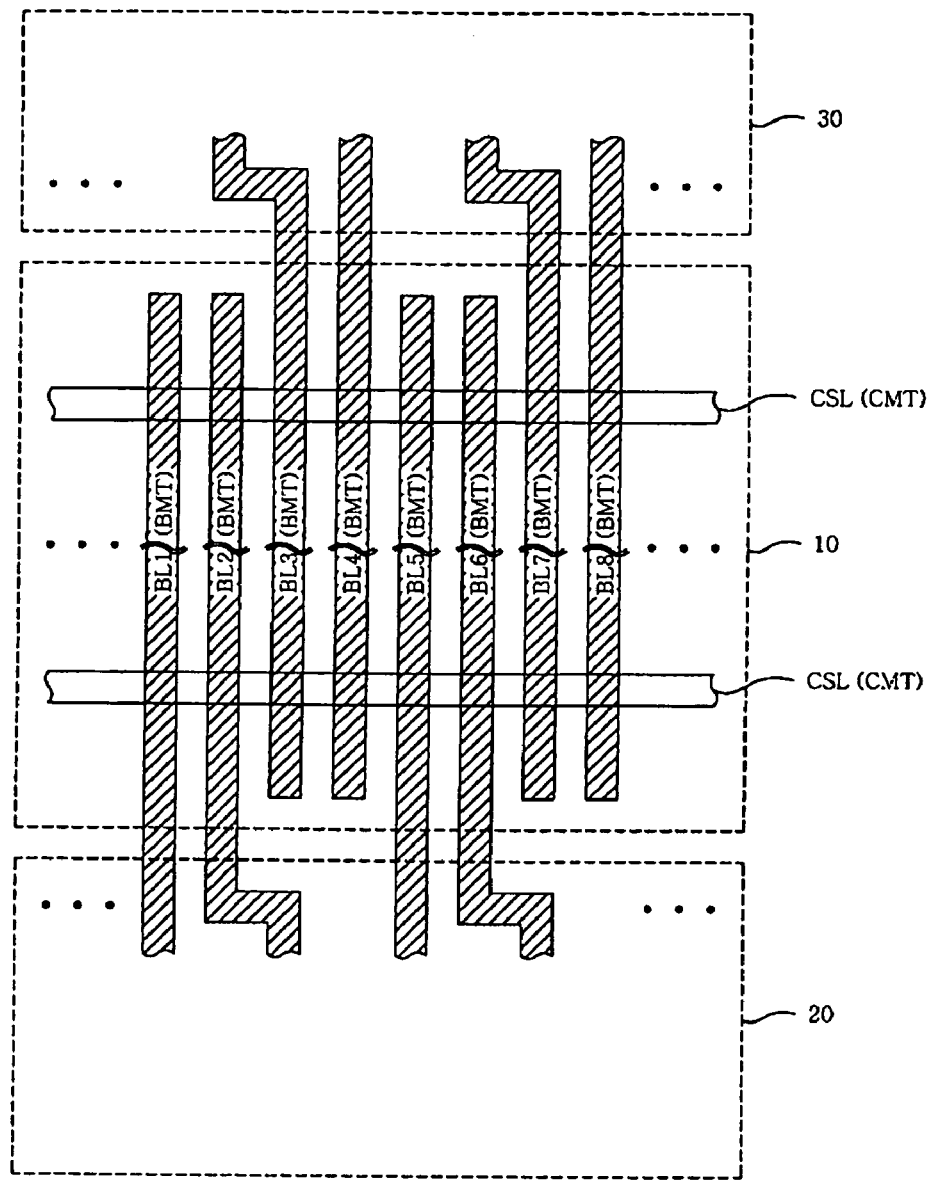
Figure 3:
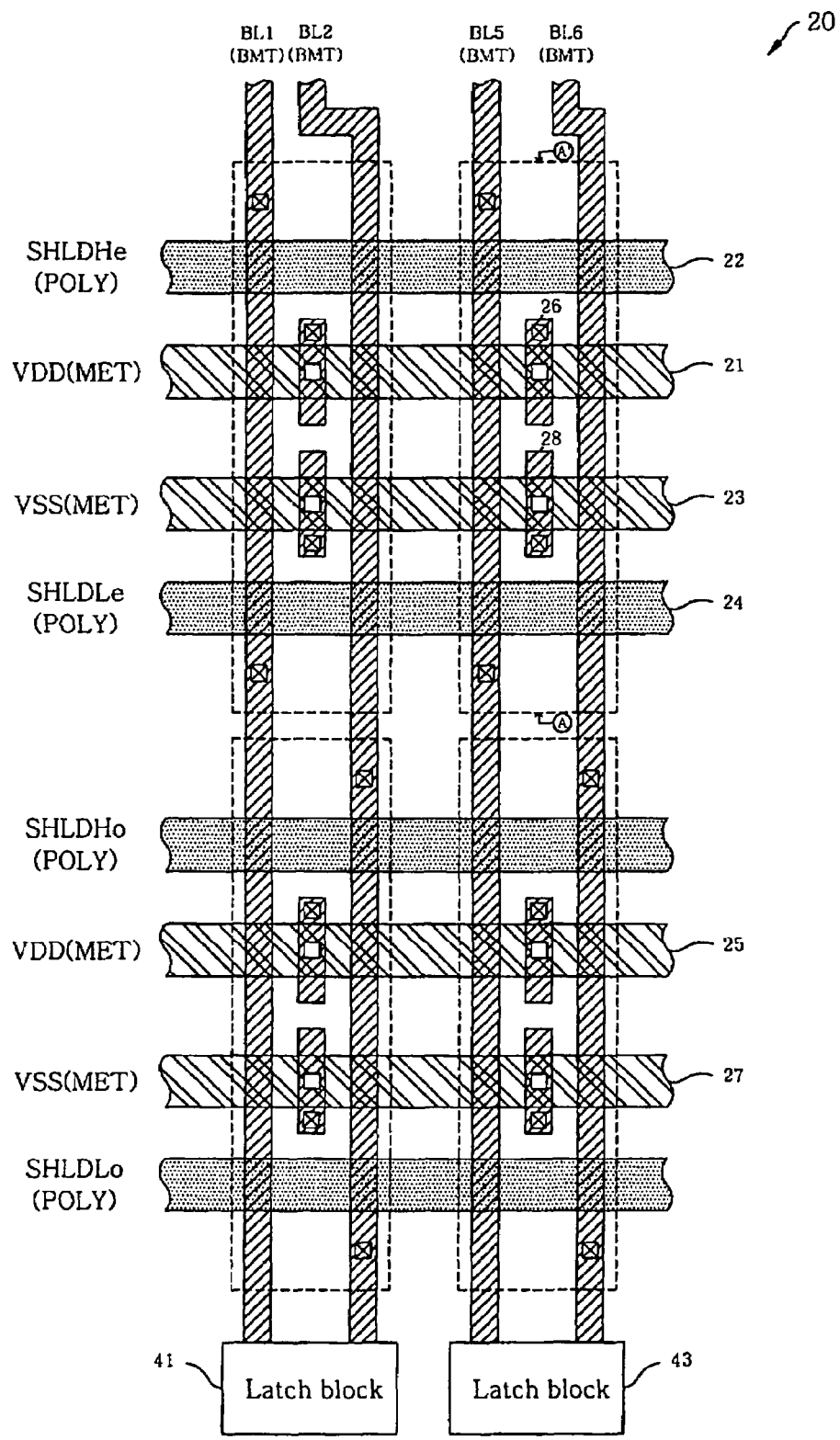
FIGS. 3 and 4 are layout diagrams of voltage control blocks shown in FIG. 2.
Figure 4:
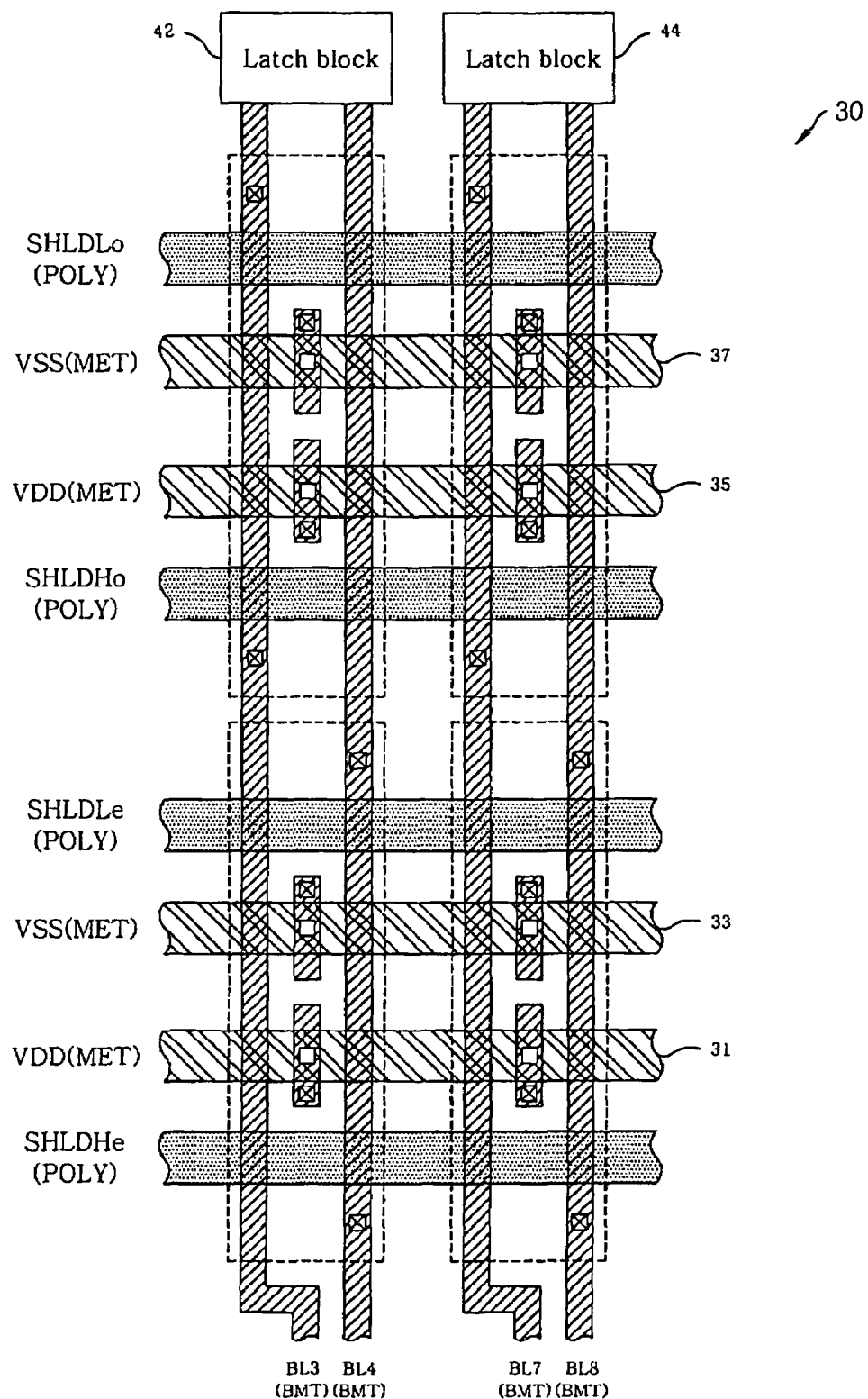
Figure 5:
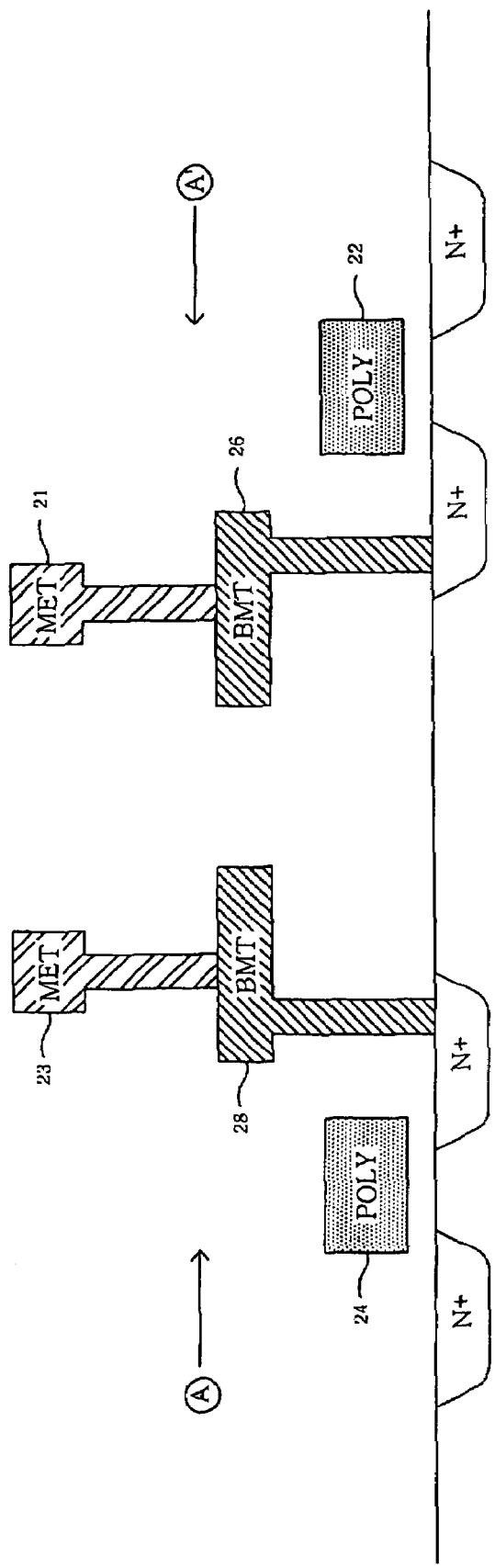
FIG. 5 is a cross-sectional diagram taken along a line A-A' in the layout shown in FIG. 3.
Figure 6:
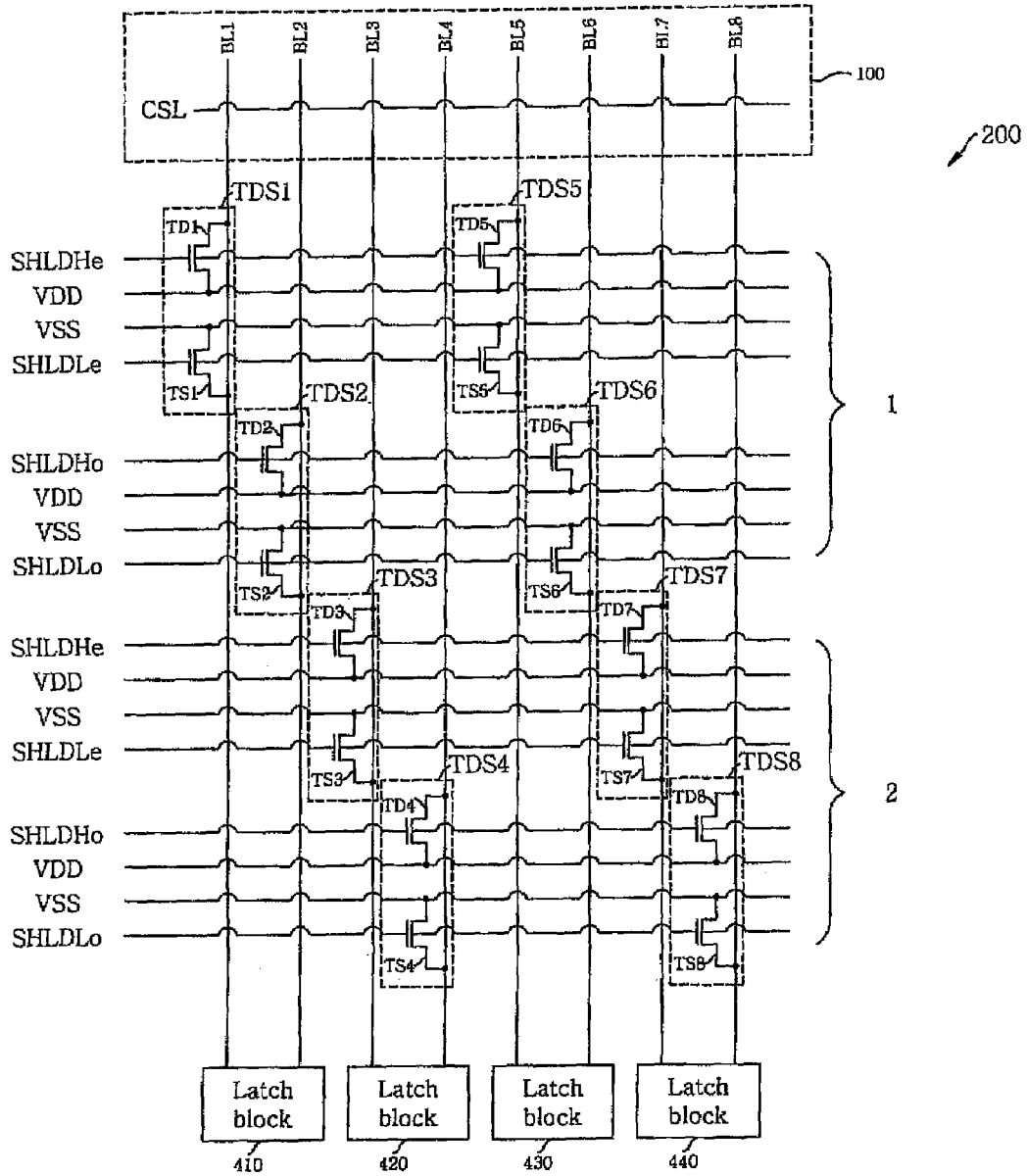
FIGS. 6 and 7 are circuit and layout diagrams illustrating interconnections between bitlines and a voltage control block in a nonvolatile semiconductor memory device according to an embodiment of the invention.
Figure 7:
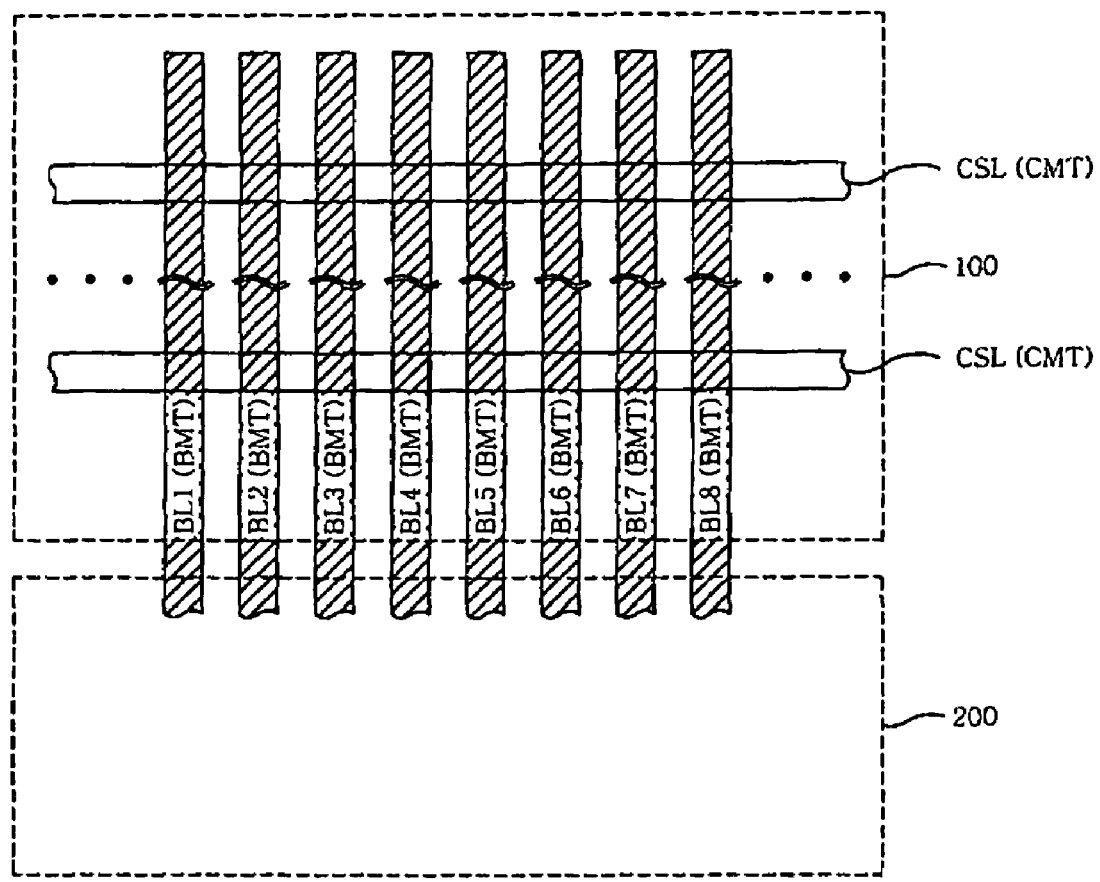

FIGS. 6 and 7 are circuit and layout diagrams illustrating interconnections between bitlines and a voltage control block in a nonvolatile semiconductor memory device according to an embodiment of the present invention.

Referring to FIGS. 6 and 7, the nonvolatile semiconductor memory device comprises a cell array 100 and a voltage control block 200. Cell array 100 comprises a plurality of bitlines arranged along a single direction with predetermined pitches. More specifically, cell array 100 comprises eight bitlines BL1 through BL8 formed in a bit layer BMT.

FIGS. 6 and 7 use eight bitlines as a practical teaching example. However, the number of bitlines can be varied without departing from the scope of the invention.

Figure 8:
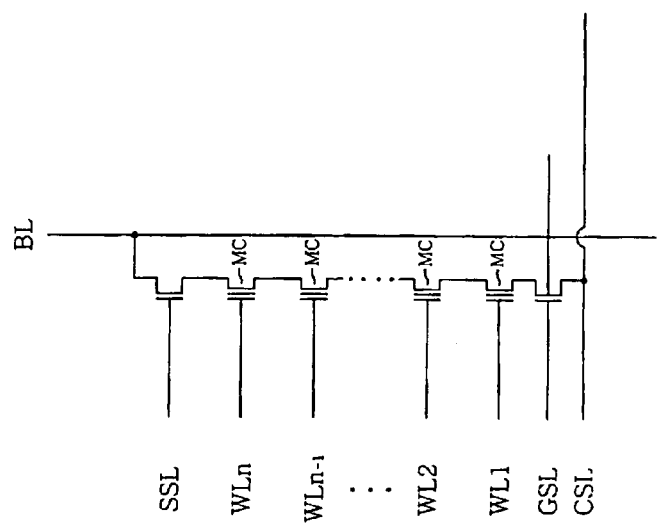
FIG. 8 is a circuit diagram illustrating a bitline and a common source line in a cell array.

Each of bitlines BL1 through BL8 is coupled to a plurality of memory cells MC as illustrated in FIG. 8. Data bits are input (i.e., programmed) into or output (i.e., read) from memory cells MC through respective bitlines connected thereto. Cell array 100 further comprises a common source line CSL supplying a predetermined voltage (usually, ground VSS) to memory cells MC connected to each bitline.

FIG. 8, shows a part of cell array 100 in a NAND-type nonvolatile semiconductor memory device. The NAND-type nonvolatile semiconductor memory device is used for illustration purposes. However, cell array 100 could also be formed as another type of nonvolatile memory device such as a NOR-type nonvolatile semiconductor memory device.

In FIG. 8, each of the plurality of memory cells MC is gated by a corresponding one of a plurality of wordlines WL1 through WLn. Memory cells MC are connected in series to form a string architecture with one end connected to a bitline BL and another end connected to common source line CSL. A string selection line SSL controls a select transistor adapted to connect the string architecture to bitline BL, and a ground selection line GSL controls a ground transistor adapted to connect the string architecture to common source line CSL. In FIG. 8, bitline BL may be one of bitlines BL1 through BL8 shown in FIGS. 6 and 7.

Common source line CSL is formed of a common source layer CMT, which is formed before bit layer BMT. Therefore, if common source layer CMT overlaps with bit layer BMT from a top perspective, common source layer CMT is located under bit layer BMT.

Voltage control block 200 comprises a plurality of voltage control circuits TDS1 through TDS8 corresponding to bitlines BL1 through BL8. Voltage control circuits TDS1 through TDS8 comprise precharge transistors TD1 through TD8 and discharge transistors TS1 through TS8. Precharge transistors TD1 through TD8 charge corresponding bitlines BL1 through BL8 to a power source voltage VDD and discharge transistors TS1 through TS8 discharge corresponding bitlines BL1 through BL8 to ground VSS.

In FIGS. 6 and 7, a signal SHLDHe controls precharge transistors, TD1, TD3, TD5, and TD7, to precharge corresponding bitlines, BL1, BL3, BL5, and BL7 to power source voltage VDD, and a signal SHLDLe controls discharge transistors, TS1, TS3, TS5, and TS7 to discharge corresponding bitlines, BL1, BL3, BL5, and BL7, to ground VSS.

Also in FIGS. 6 and 7, a signal SHLDHo controls precharge transistors, TD2, TD4, TD6, and TD8 to precharge corresponding bitlines BL2, BL4, BL6, and BL8 to power source voltage VDD, and a signal SHLDLo controls discharge transistors TS2, TS4, TS6, and TS8 to discharge corresponding bitlines, BL2, BL4, BL6, and BL8, to ground VSS.

Where memory cells connected to bitlines BL1, BL3, BL5, and BL7 are selected by signals SHLDHe and SHLDLe, bitlines BL2, BL4, BL6, and BL8 corresponding to signals SHLDHo and SHLDLo function to shield the selected memory cells from electrically influencing each other. Similarly, where memory cells connected to bitlines BL2, BL4, BL6, and BL8 are selected by signals SHLDHo and SHLDLo, bitlines BL1, BL3, BL5, and BL7, corresponding to signals SHLDHe and SHLDLe function to shield the selected memory cells from electrically influencing each other.

Therefore, bitlines BL1, BL3, BL5, and BL7 corresponding to signals SHLDHe and SHLDLe, and bitlines BL2, BL4, BL6, and BL8 corresponding to signals SHLDHo and SHLDLo are driven in pairs.

Figure 9A:
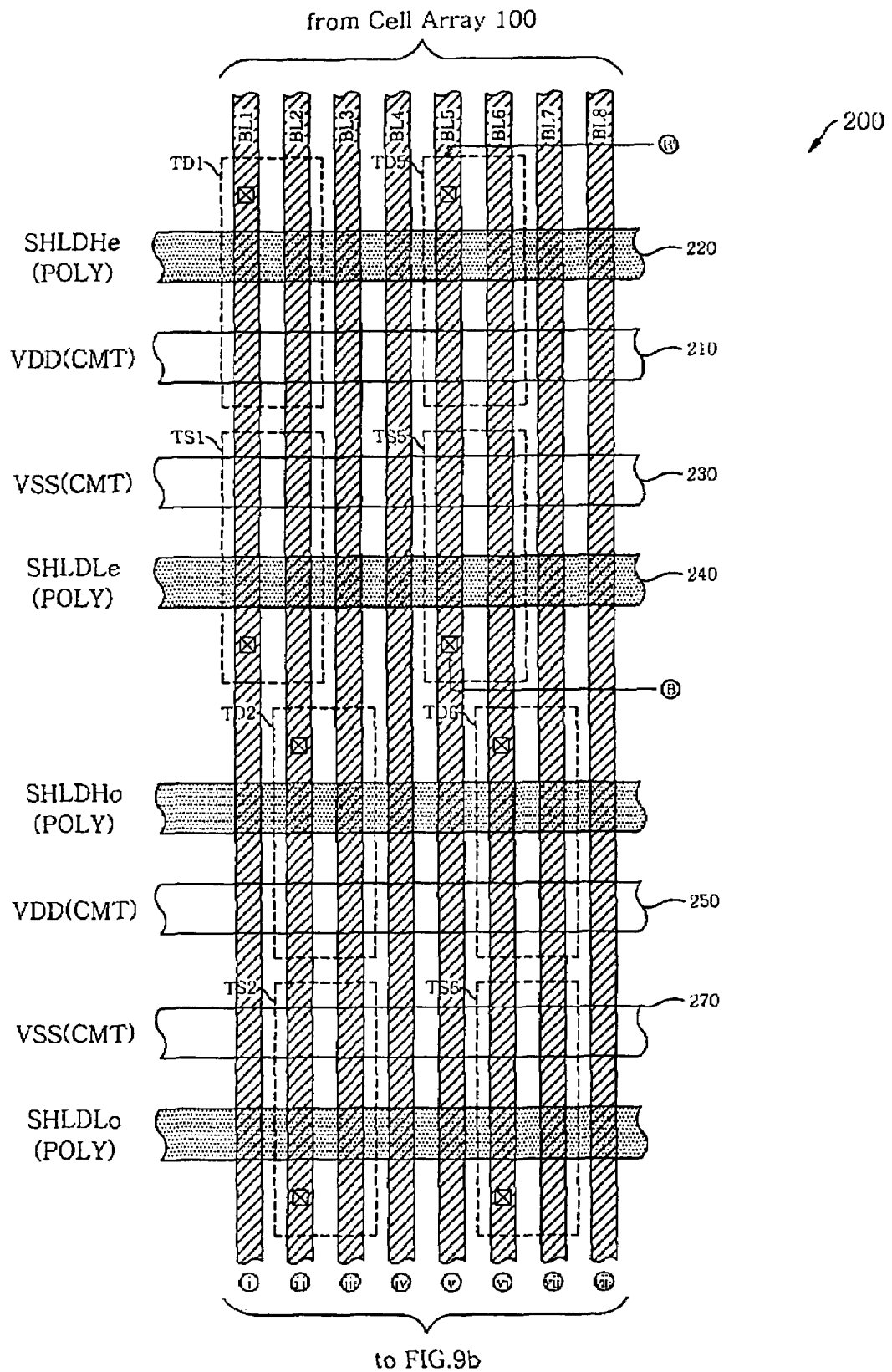
FIGS. 9A and 9B are layout diagrams illustrating portions of a voltage control block 200 shown in FIG. 7.
Figure 9B:
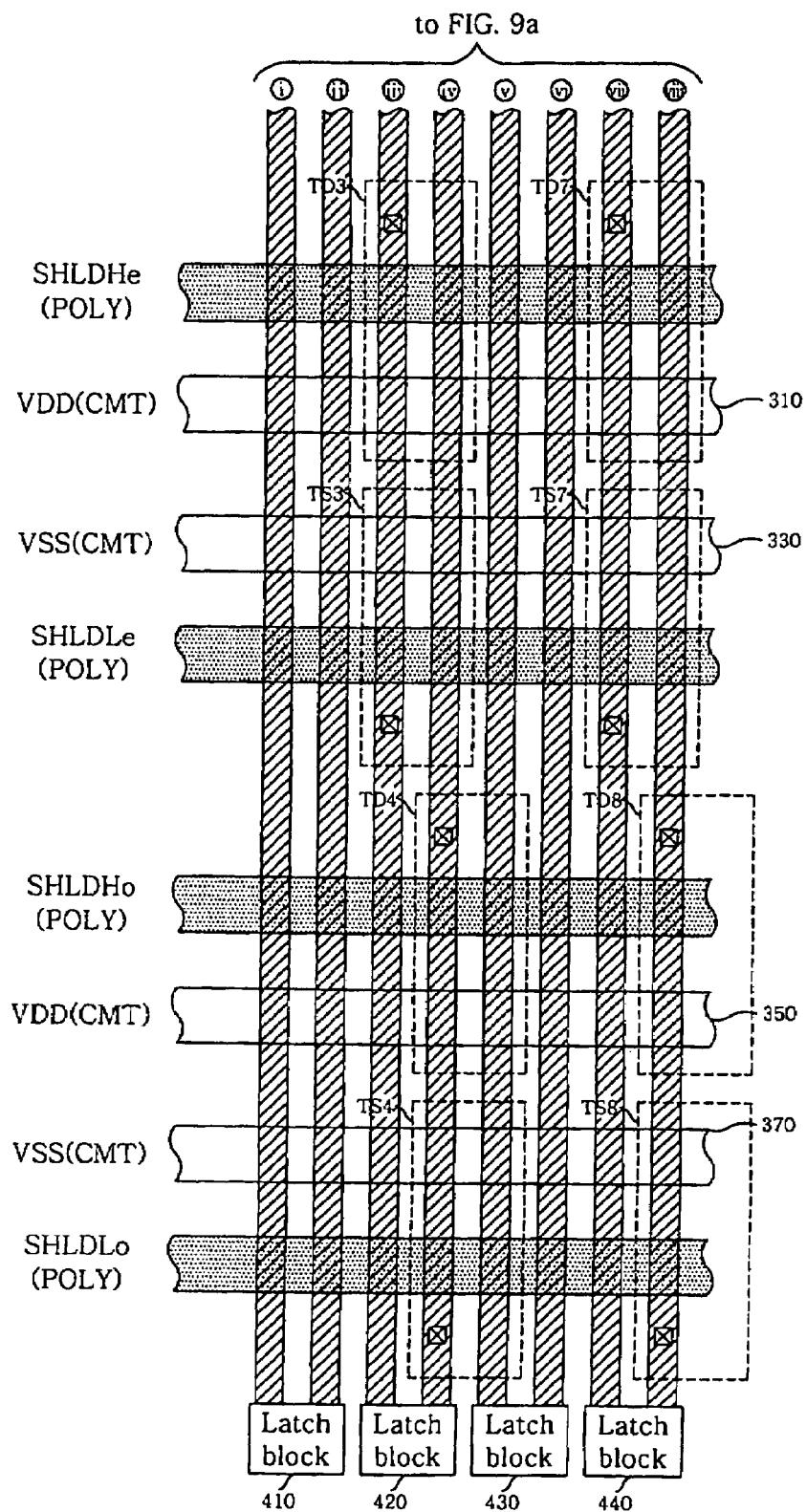

FIGS. 9A and 9B are layout diagrams illustrating portions of voltage control block 200 shown in FIG. 7. Referring to FIGS. 9A and 9B, power source voltage lines 210, 250, 310, and 350, which supply power source voltage VDD to precharge transistors TD1 through TD8, are formed in a "voltage-line metal layer". In addition, ground voltage lines, 230, 270, 330, and 370, which supply ground VSS to discharge transistors TS1 through TS8, are also formed in voltage line metal layer. Generically, power source voltage lines, 210, 250, 310, and 350, and ground voltage lines 230, 270, 330, and 370, may be referred to as "voltage supply lines".

Preferably, the voltage-line metal layer is as same as common source layer CMT.

Figure 10:
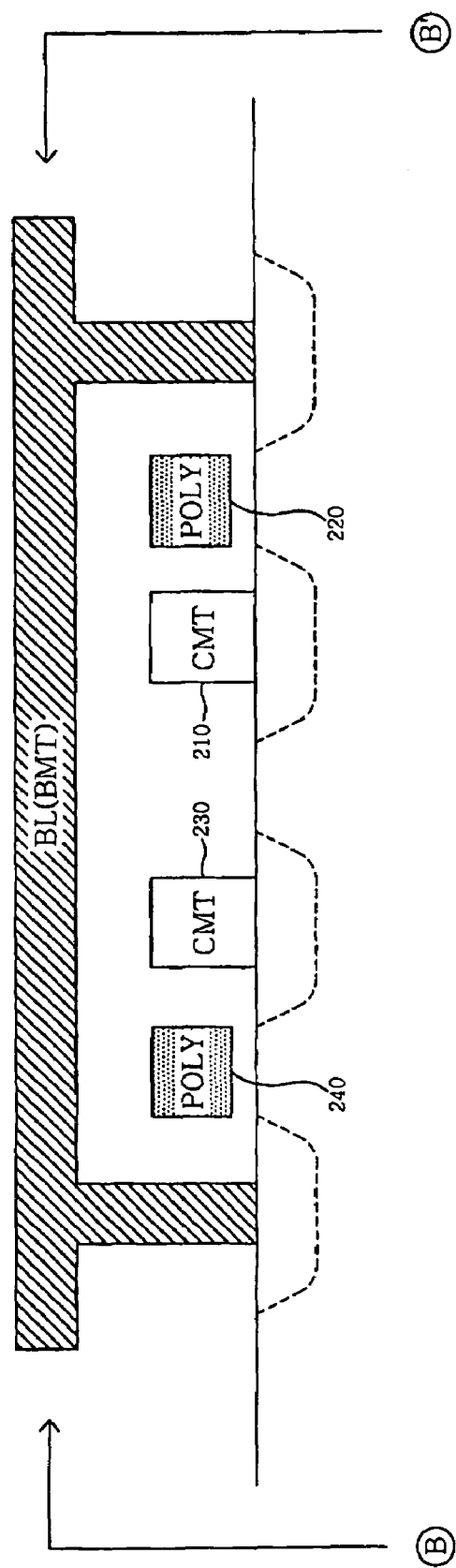
FIG. 10 is a cross-sectional diagram taken along a line B-B' in the layout shown in FIG. 9A.

In contrast to metal layer MET of FIGS. 2 through 5, the voltage-line metal layer does not contact bit layer BMT. In other words, as illustrated in FIG. 10, power source voltage lines, 210, 250, 310, and 350, and ground voltage lines, 230, 270, 330, and 370, make direct contact with source/drain junctions of precharge and discharge transistors TD1 through TD8 and TS1 through TS8. Accordingly, bitlines BL1 through BL8 are all able to extend in one direction from cell array 100.

Therefore, as shown in FIGS. 6 and 7, voltage control circuits TDS1 through TDS8 included in voltage control block 200 on one side of cell array 100.

Typically, precharge and discharge transistors TD1 through TD8 and TS1 through TS8 have gate terminals formed of polycrystalline silicon (POLY). Similarly, conductive lines carrying signals SHLDHe, SHLDLe, SHLDHo, and SHLDLo are also generally formed of polycrystalline silicon.

As shown in FIGS. 6 and 9b, pairs of adjacent bitlines are connected to latch blocks 410, 420, 430, and 440, and each pair of adjacent bitlines has a corresponding pair of voltage control circuits. In this written description, the term "voltage control circuit pair" refers to a pair of voltage control circuits connected to a pair of adjacent bitlines connected to the same latch block.

Voltage control circuit pairs, TDS1/TDS2, TDS3/TDS4, TDS5/TDS6, and TDS7/TDS8, corresponding to bitline pairs BL1/BL2, BL3/BL4, BL5/BL6, and BL7/BL8, are arranged in alternating rows, labeled "1", and "2" in FIG. 6 in parallel with common source line CSL. In particular, voltage control circuit pairs TDS1/TDS2 and TDS5/TDS6, are located in row "1", and voltage control circuit pairs TDS3/TDS4 and TDS7/TDS8 are located in row "2". Based on the alternating arrangement of voltage control circuit pairs along rows "1" and "2", it is possible to compose a layout for active regions in cell array 100.

Figure 11:
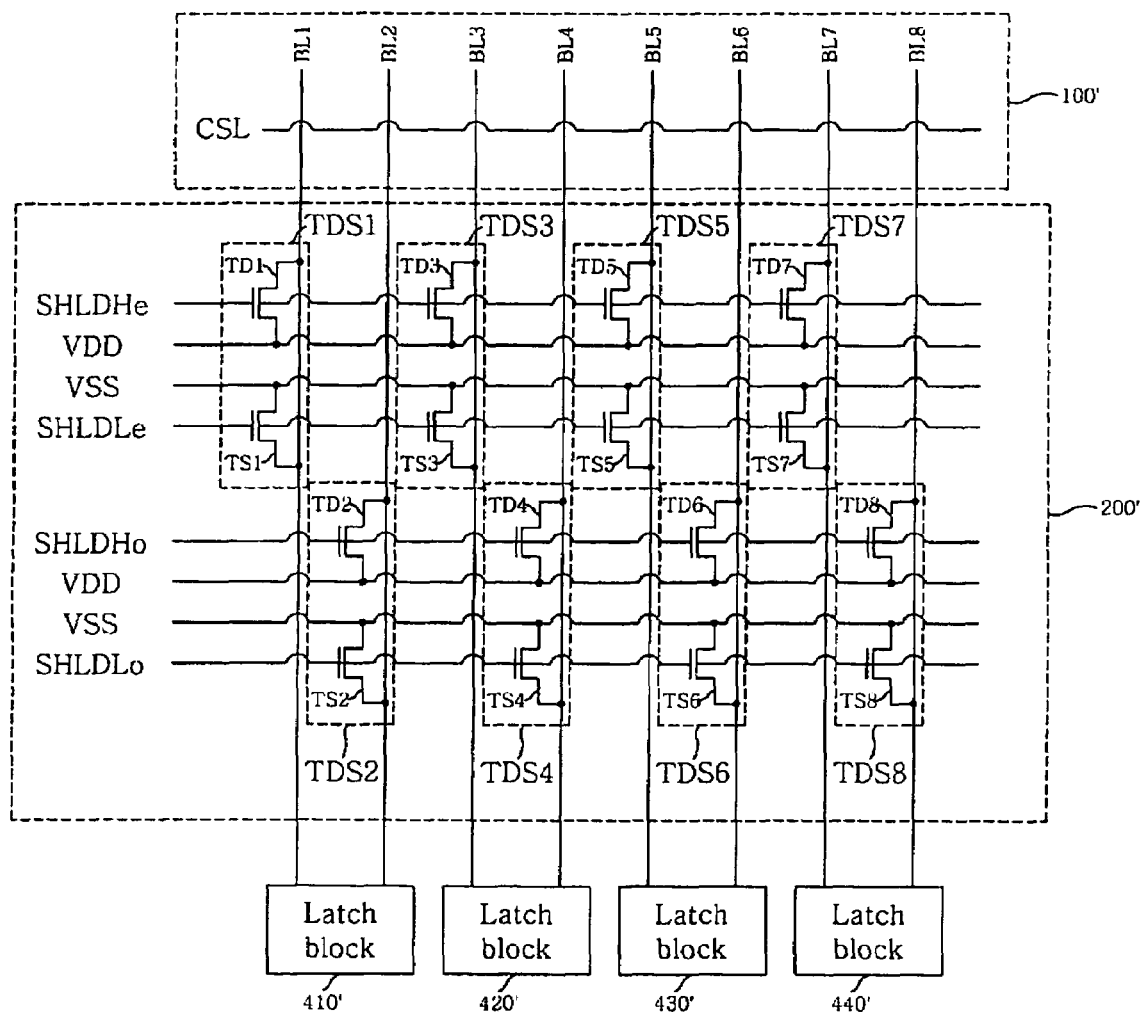
FIG. 11 is a circuit diagram illustrating interconnections between bitlines and a voltage control block in a nonvolatile semiconductor memory device according to another embodiment of the invention.
Figure 12:
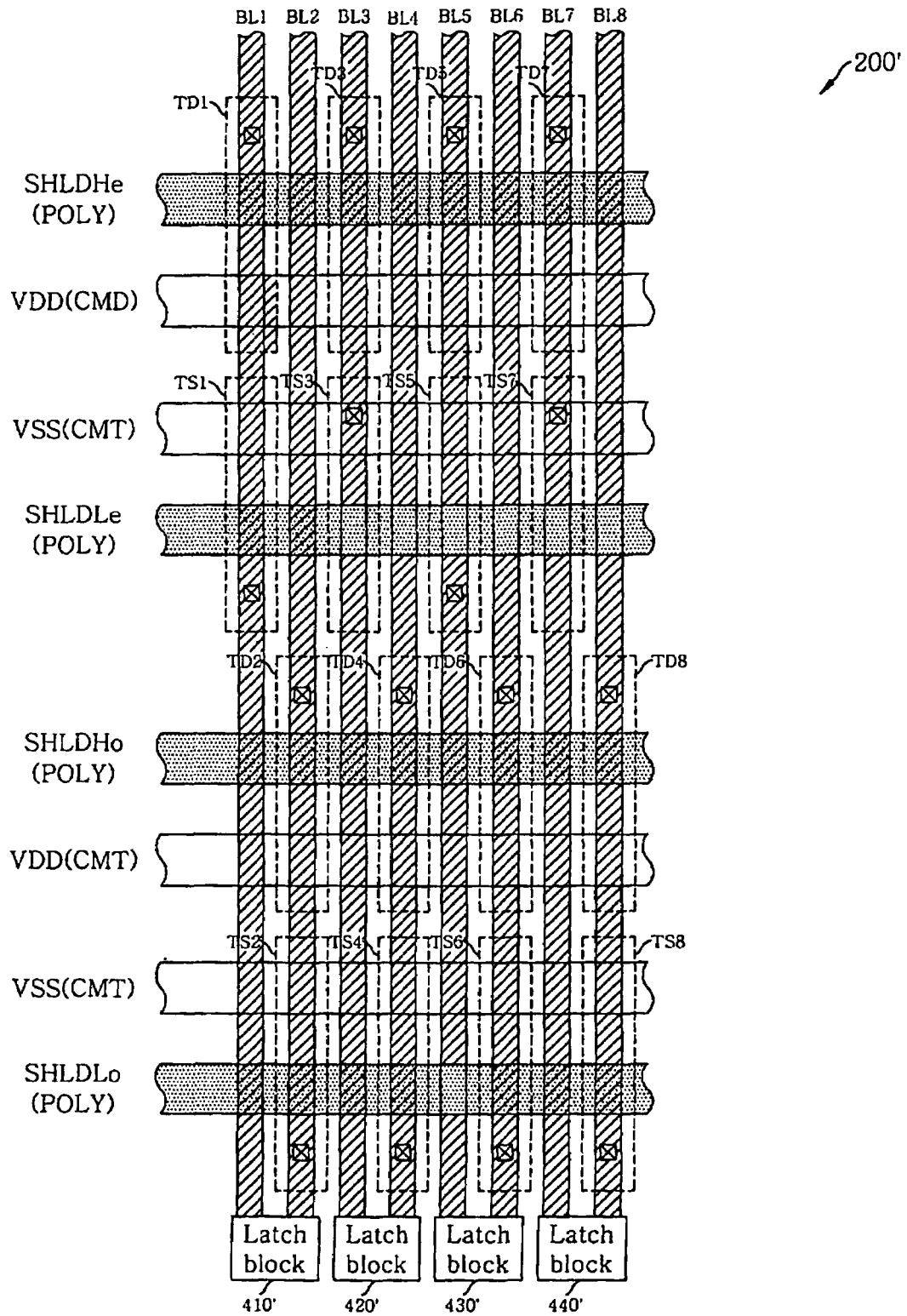
FIG. 12 is a layout diagram of the voltage control block shown in FIG. 11.

FIG. 11 is a circuit diagram illustrating interconnections between bitlines BL1 through BL8 and a voltage control block 200' in a nonvolatile semiconductor memory device according to another embodiment of the present invention, and FIG. 12 is a layout diagram of voltage control block 200'.

Voltage control block 200' shown in FIG. 11 is similar to voltage control block 200 shown in FIG. 6 in that bitlines BL1 through BL8 extend toward voltage control block 200' on one side of a cell array 100' and are connected each to corresponding voltage control circuits TDS1 through TDS8 included in voltage control block 200'.

In contrast to voltage control block 200, however, voltage control circuit pairs TDS1/TDS2, TDS3/TDS4, TDS5/TDS6, and TDS7/TDS8 in voltage control block 200' are arranged in a single row. As a result, the layout area of voltage control block 200' is significantly reduced relative to voltage control block 200, as illustrated by FIG. 12.

In the nonvolatile semiconductor memory device illustrated in FIGS. 11 and 12, pairs of adjacent bitlines are connected to corresponding latch blocks 410', 420', 430', and 440', similar to the semiconductor memory device shown in FIG. 6.

In the semiconductor memory device shown in FIGS. 11 and 12, where memory cells connected to bitlines, BL1, BL3, BL5, and BL7, corresponding to signals SHLDHe and SHLDLe, are selected, bitlines BL2, BL4, BL6, and BL8 corresponding to signals SHLDHo and SHLDLo function to electrically shield the selected bitlines from electrically influencing each other. Similarly, where memory cells connected to bitlines, BL2, BL4, BL6, and BL8, corresponding to signals SHLDHo and SHLDLo, are selected, bitlines BL1, BL3, BL5, and BL7 corresponding to signals SHLDHe and SHLDLe function to electrically shield the selected bitlines from electrically influencing each other.

In the semiconductor memory device shown in FIGS. 11 and 12, signals SHLDHe, SHLDLe, SHLDHo, and SHLDLo function the same as in the semiconductor memory device illustrated in FIGS. 6 through 10. Likewise, precharge and discharge transistors TD1 through TD8 and TS1 through TS8 also function the same as in the semiconductor memory device illustrated in FIGS. 6 through 10.

In a nonvolatile semiconductor memory device according to various embodiment of the present invention, bitlines extending from a cell array are connected to voltage control circuits and latch blocks arranged on the same side of the cell array. Therefore, it is possible to very reduce the problem of skew between data bits input to or output from the cell array. By reducing the data skew, the configuration of the control circuit regulating data input/output operations is simplified. As a result, the layout area of the semiconductor memory device is significantly reduced.

In addition, where the voltage-line metal layer is the same as the common source layer, it is possible for the voltage-line metal layer to be otherwise implemented without relevant to the common source layer. But, in this case, it is required of forming the voltage-line metal layer before completing the bit layer.

The foregoing preferred embodiments are teaching examples. Those of ordinary skill in the art will understand that various changes in form and details may be made to the exemplary embodiments without departing from the scope of the present invention as defined by the following claims.

What is claimed is:

1. A nonvolatile semiconductor memory device, comprising:
   a cell array comprising a plurality of memory cells;
   a plurality of bitlines formed in a bit layer and connected to the plurality of memory cells, the bitlines extending from the cell array along a first direction;
   a common source line formed in a common source layer and adapted to provide a predetermined source voltage to the plurality of memory cells; and
   a voltage control block comprising a plurality of voltage control circuits adapted to control the voltage levels of the plurality of bitlines through voltage supply lines formed in a voltage-line metal layer;
   wherein the voltage control circuits are formed on only one side of the cell array.

2. The nonvolatile semiconductor memory device of claim 1, wherein the voltage-line metal layer is formed before the bit layer.

3. The nonvolatile semiconductor memory device of claim 2, wherein the voltage-line metal layer is the same as the common source layer.

4. The nonvolatile semiconductor memory device of claim 3, wherein the voltage control circuits are arranged in voltage control circuit pairs corresponding to pairs of adjacent bitlines in the plurality of bitlines; and
   wherein the voltage control circuit pairs are alternately arranged on first and second rows parallel to the common source line.

5. The nonvolatile semiconductor memory device of claim 3, wherein the voltage control circuits are arranged in voltage control circuit pairs corresponding to pairs of adjacent bitlines in the plurality of bitlines; and
   wherein the voltage control circuit pairs are alternately arranged on a single row parallel to the common source line.

6. The nonvolatile semiconductor memory device of claim 5, wherein each of the pairs of adjacent bitlines is connected to a corresponding latch block.

7. The nonvolatile semiconductor memory device of claim 1, wherein the nonvolatile semiconductor memory device is an NAND-type nonvolatile semiconductor memory device in which the plurality of memory cells are arranged in a string architecture.

8. The nonvolatile semiconductor memory device of claim 1, wherein each of the voltage supply lines comprises:
   a power source voltage line adapted to supply a power source voltage for precharging the bitline; and
   a ground voltage line adapted to supply a ground voltage for discharging the bitline.

9. The nonvolatile semiconductor memory device of claim 8, wherein each of the voltage control circuits receives one of the voltage supply lines, and comprises:
   a precharge transistor connected between one of the plurality of bitlines and the power source voltage line of the voltage supply line; and,
   a discharge transistor connected between another one of the plurality of bitlines and the ground voltage line of the voltage supply line.

10. The nonvolatile semiconductor memory device of claim 9, wherein the precharge and discharge transistors have gate terminals formed of polycrystalline silicon, and wherein conductive lines connected to the gate terminals are also formed of polycrystalline silicon.

11. A nonvolatile semiconductor memory device, comprising:
- a cell array comprising a plurality of memory cells;
- a plurality of bitlines formed in a bit layer and connected to the plurality of memory cells, the bitlines extending from the cell array along a first direction;
- a common source line formed in a common source layer and adapted to provide a predetermined source voltage to the plurality of memory cells; and
- a voltage control block comprising a plurality of voltage control circuits adapted to control the voltage levels of the plurality of bitlines through voltage supply lines formed in a voltage-line metal layer below the bit layer.

12. The nonvolatile semiconductor memory device of claim 11, wherein the voltage-line metal layer is the same as the common source layer.

13. The nonvolatile semiconductor memory device of claim 12, wherein the voltage control circuits are arranged in voltage control circuit pairs corresponding to pairs of adjacent bitlines in the plurality of bitlines; and
- wherein the voltage control circuit pairs are alternately arranged on first and second rows parallel to the common source line.

14. The nonvolatile semiconductor memory device of claim 12, wherein the voltage control circuits are arranged in voltage control circuit pairs corresponding to pairs of adjacent bitlines in the plurality of bitlines; and
- wherein the voltage control circuit pairs are alternately arranged on a single row parallel to the common source line.

15. The nonvolatile semiconductor memory device of claim 14, wherein each of the pairs of adjacent bitlines is connected to a corresponding latch block.

16. The nonvolatile semiconductor memory device of claim 11, wherein the nonvolatile semiconductor memory device is an NAND-type nonvolatile semiconductor memory device in which the plurality of memory cells are arranged in a string architecture.

17. The nonvolatile semiconductor memory device of claim 11, wherein each of the voltage supply lines comprises:
- a power source voltage line adapted to supply a power source voltage for precharging the bitline; and
- a ground voltage line adapted to supply a ground voltage for discharging the bitline.

18. The nonvolatile semiconductor memory device of claim 17, wherein each of the voltage control circuits receives one of the voltage supply lines, and comprises:
- a precharge transistor connected between one of the plurality of bitlines and the power source voltage line of the voltage supply line; and,
- a discharge transistor connected between another one of the plurality of bitlines and the ground voltage line of the voltage supply line.

19. The nonvolatile semiconductor memory device of claim 18, wherein the precharge and discharge transistors have gate terminals formed of polycrystalline silicon, and wherein conductive lines connected to the gate terminals are also formed of polycrystalline silicon.

* * * * *